(12) United States Patent
Ishii

(10) Patent No.: US 7,465,960 B2
(45) Date of Patent: Dec. 16, 2008

(54) SUBMOUNT FOR LIGHT EMITTING/RECEIVING DEVICE

(75) Inventor: Yorishige Ishii, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 32 days.

(21) Appl. No.: 10/579,008

(22) PCT Filed: Nov. 4, 2004

(86) PCT No.: PCT/JP2004/016314

§ 371 (c)(1),
(2), (4) Date: May 10, 2006

(87) PCT Pub. No.: WO2005/048359

PCT Pub. Date: May 26, 2005

(65) Prior Publication Data

US 2007/0121696 A1    May 31, 2007

(30) Foreign Application Priority Data

Nov. 14, 2003    (JP)    ............................. 2003-385752

(51) Int. Cl.
 *H01L 33/00*    (2006.01)
(52) U.S. Cl. ............................. 257/98; 257/80; 257/99; 257/E51.018
(58) Field of Classification Search ............. 257/98–99, 257/79, E33.072, E33.074, E33.075, E31.117, 257/E31.127, 80, 434, 448, 461; 362/241; 385/14

See application file for complete search history.

(56) References Cited

U.S. PATENT DOCUMENTS

| 6,898,340 | B2 * | 5/2005 | Tanaka ........................ 385/14 |
| 7,009,213 | B2 * | 3/2006 | Camras et al. ................ 257/98 |
| 7,019,374 | B2 * | 3/2006 | Kayanuma et al. .......... 257/432 |
| 7,057,697 | B2 * | 6/2006 | Liu ............................. 349/141 |
| 7,202,181 | B2 * | 4/2007 | Negley ....................... 438/745 |
| 7,233,028 | B2 * | 6/2007 | Weeks et al. .................. 257/98 |
| 2002/0176468 | A1 * | 11/2002 | Kaneko ........................ 372/50 |
| 2004/0012958 | A1 | 1/2004 | Hashimoto et al. |

FOREIGN PATENT DOCUMENTS

JP    2-50104    2/1990

(Continued)

*Primary Examiner*—Wai-Sing Louie
(74) *Attorney, Agent, or Firm*—Edwards Angell Palmer & Dodge LLP; David G. Conlin; Peter J. Manus

(57) ABSTRACT

In a submount main body (1) composed of a single crystal silicon, a mounting surface (4) on which a light-emitting device (11) is mounted is composed of a (100)-oriented surface and the inner surface of a through hole (3) which is formed by anisotropic etching is parallel to the (110)-oriented surface. The light-emitting portion of the light-emitting device (11) is arranged to face a device-side opening (31) which opens into the mounting surface (4) of the submount main body (1). Consequently, heat generated in the light-emitting device (11) can be discharged to the outside more efficiently than the case where the light-emitting portion is arranged to face a side opposite to the submount side. Specifically, light from the light-emitting device (11) is reflected by a reflective surface formed on the surface of the through hole (3), and highly efficiently transmitted outside of the submount main body (1).

4 Claims, 8 Drawing Sheets

FOREIGN PATENT DOCUMENTS

| | | |
|---|---|---|
| JP | 07-007184 | 1/1995 |
| JP | 8139367 | 5/1996 |
| JP | 08-228044 | 9/1996 |
| JP | 10-012472 | 1/1998 |
| JP | 10-215001 | 8/1998 |
| JP | 2000-012910 | 1/2000 |
| JP | 2000-294831 | 10/2000 |
| JP | 2001-13309 | 1/2001 |
| JP | 2001-059922 | 3/2001 |
| JP | 2001-250899 | 9/2001 |
| JP | 2002-246653 | 8/2002 |
| JP | 2002-261375 | 9/2002 |
| JP | 2002-270859 | 9/2002 |
| JP | 2003-168829 | 6/2003 |
| JP | 2003-258300 | 9/2003 |
| JP | 2003-302509 | 10/2003 |

* cited by examiner

SUBMOUNT FOR LIGHT EMITTING/RECEIVING DEVICE

TECHNICAL FIELD

The present invention relates to a submount for a light emitting/receiving device which is used for, for example, optical communications, automobiles and the like and which requires reduction of power consumption and performance of heat dissipation.

BACKGROUND ART

In recent years, together with the progress toward higher brightness of LEDs (Light Emitting Diodes), there has been an increasing demand for higher heat dissipation to the submount on which those LEDs are mounted. As an example of the submount of high heat dissipation, a submount using diamond is cited. The submount of diamond is used in optical communication systems for long distance transmission. Optical communication systems for long distance transmission, because of their relatively high prices, permit the use of higher-cost component parts such as diamond.

However, low-priced submounts are indispensable for cost reduction in the illumination or on-vehicle equipment using plural high-brightness LEDs or in the optical communication systems for long distance transmission of relatively low set prices. In these kinds of equipment or system, therefore, in order to enhance cost reduction as well as heat dissipation, it has been practiced that a face of an end-face emission type LD (Laser Diode), the face being close to its active layer, is die-bonded onto a submount of relatively low price which is formed by a chip of SiC (silicon carbide) or other ceramic or Si (silicon) chip.

In the case where a plane-emission type LED or plane-reception type PD (photodiode) is used as a light emitting/receiving device for the aforementioned equipment, there is a need for ensuring an optical path for input or output of light to or from the light emitting/receiving device in a direction perpendicular to one surface of the submount on which the light emitting/receiving device is mounted.

FIG. 9A is a sectional view showing a light guide unit including a conventional submount having a through hole (see JP 2001-59922 A). This light guide unit has a plane-emission type light-emitting device 102 mounted at an end of a light guide member 103 serving as a submount. The light emitting plane of the light-emitting device 102 faces an opening provided at one end of the light guide member 103. The opening of the light guide member 103 is a through hole formed in the light guide member 103. The through hole is formed into such a shape as to increasingly widen toward the other end of the light guide member 103 and to open at the other end of the light guide member 103. A light transmitting member 104 for transmitting light derived from the light-emitting device 102 is placed in the through hole of the light guide member 103 so as to lead the light from the other spherical-shaped end face of the light transmitting member 104 to an optical fiber 101. The surface of the through hole of the light guide member 103 reflects the light derived from the light-emitting device 102 toward the optical fiber 101, thereby the light transmission performance is enhanced.

As shown in FIG. 9B, the light guide member 103 of a conventional submount is provided with an electrode 106 at an end thereof. The light-emitting device 102 is provided with an electrode 108 on an emission surface of the light-emitting device 102. The electrode 108 is connected to the electrode 106.

However, there would be a problem of poor heat dissipation in the light-emitting device 102 when the light guide member 103 is made of a light-pervious material such as glass or light-pervious resin for enhancement of the light transmission performance. This is because thermal conductivity of the light guide member 103 is relatively low. There is also a problem that the submount becomes expensive since the light-pervious material is higher in price than Si material or the like. In the case where the light guide member 103 is formed from a metal material by metal stamping at low cost, there can be a problem that it is difficult to obtain an excellent reflecting surface, that is, excellent light transmission performance since the surface of the through hole is liable to flaws.

DISCLOSURE OF INVENTION

Accordingly, an object of the present invention is to provide a submount for a light emitting/receiving device which is fabricated inexpensively and easily and yet which is enhanced in thermal conductivity and light transmission performance.

In order to achieve the above-mentioned object, the present invention provides a submount for a light emitting/receiving device, comprising:

- a mounting surface on which a light emitting/receiving device is mounted;
- a device-side opening which is provided in the mounting surface and through which light inputted to or outputted from the light emitting/receiving device passes;
- an outer opening provided in a face facing the mounting surface;
- a reflecting surface which adjoins the device-side opening and the outer opening and which is formed parallel with a specified crystal orientation face so as to reflect the light between one side on which the light emitting/receiving device is provided and another side on which the outer opening is opened.

According to this invention, the reflecting surface reflects light, which has been inputted to or outputted from the light emitting/receiving device, between one side on which the light emitting/receiving device is provided and another side on which the outer opening is opened. The reflecting surface is formed so as to be parallel with a specified crystal orientation face. Therefore, light reflectivity of the reflecting surface is relatively large. Also, it is easy to form the reflecting surface parallel with the crystal orientation face by crystal-anisotropic etching for example. Consequently, the submount for the light emitting/receiving device having excellent light transmission performance can be formed easily.

In one embodiment of the present invention,
- the submount is formed of single crystal silicon,
- the mounting surface is parallel with a (100)-oriented surface of the single crystal silicon, and
- the reflecting surface is parallel with a (111)-oriented surface of the single crystal silicon.

According to this embodiment, the (111)-oriented surface can easily be formed by performing crystal anisotropic etching with the use of, for example, alkaline aqueous solution with respect to single crystal silicon having a surface which is a (100)-oriented surface. Therefore, it is possible to easily form a reflecting surface having an excellent reflectivity for light inputted to or outputted from the light emitting/receiving device. Also, the single crystal silicon has a good thermal conductivity. Those make it possible to easily and inexpensively form the submount which has excellent light transmissibility and excellent heat dissipation for the light emitting/receiving device.

In one embodiment of the present invention, the submount for the light emitting/receiving device further comprises:
- a through hole for connecting the device-side opening and the outer opening to each other;
- a first metal film formed on an inner side face of the through hole; and
- a second metal film formed on a surface of the first metal film, wherein
- a surface of the second metal film serves as the reflecting surface.

According to this embodiment, the first metal film is formed on the inner side face of the through hole, and the second metal film is formed on the surface of the first metal film. Therefore, since the second metal film does not make contact with the inner side face of the through hole, such disadvantages can be prevented as diffusion of the material of the second metal film into the material of the inner side face portion of the through hole or its crystallization. As a consequence, the surface of the second metal film, which is the reflecting surface, can reflect the light stably with high efficiency, so that a submount having excellent transmissibility for the light can be obtained stably.

In this case, the first metal film is preferably formed by using a high melting metal film such as Ti (titanium), Cr (chromium) or Ta (tantalum). Also, preferably, the second metal film is formed with a metal having a high reflectivity such as Al (aluminum) or Au (gold).

In one embodiment of the present invention, the submount for the light emitting/receiving device further comprises:
- a through hole for connecting the device-side opening and the outer opening to each other;
- a dielectric film formed on an inner side face of the through hole; and
- a metal film formed on a surface of the dielectric film, wherein
- a surface of the metal film serves as the reflecting surface.

According to this embodiment, the dielectric film is formed on the inner side face of the through hole, and the metal film is formed on the surface of the dielectric film. Therefore, since the metal film does not make contact with the inner side face of the through hole, such disadvantages can be prevented as diffusion of the material of the metal film into the material of the inner side face portion of the through hole or its crystallization. As a consequence, the surface of the metal film can reflect the light stably with high efficiency, so that a submount having excellent transmissibility for the light can be obtained stably.

In this case, preferably, the dielectric film is an amorphous dielectric film formed by oxidizing or nitriding the inner side face portion of the through hole. Also, preferably, the metal film is formed of a metal having a high reflectivity such as Al or Au.

In one embodiment of the present invention, the submount for the light emitting/receiving device further comprises:
- a through hole for connecting the device-side opening and the outer opening to each other;
- a first metal film formed on an inner side face of the through hole;
- a dielectric film formed on a surface of the first metal film; and
- a second metal film formed on a surface of the dielectric film, wherein
- a surface of the second metal film serves as the reflecting surface.

According to this embodiment, the first metal film is formed on the inner side face of the through hole, the dielectric film is formed on the surface of the first metal film, and the second metal film is formed on the surface of the dielectric film. Therefore, since the second metal film is effectively isolated from the inner side face of the through hole, such disadvantages can reliably be prevented as diffusion of the material of the second metal film into the material of the inner side face portion of the through hole or its crystallization. As a consequence, the surface of the second metal film can reflect the light stably with high efficiency, so that a submount having excellent transmissibility for the light can be obtained stably.

In this case, preferably, the first metal film is formed by using, for example, Ti, Cr or Ta. Also, preferably, the face is formed by, for example, SiO2 or SiN. Further, preferably, the second metal film is made of a metal having a high reflectivity such as Al or Au.

In one embodiment of the present invention, the submount for the light emitting/receiving device further comprises a dielectric film which surrounds the device-side opening.

According to this embodiment, since the device-side opening is surrounded by the dielectric film, such a disadvantage can be prevented as, for example, brazing material for fixing the light emitting/receiving device on the mounting surface may intrude into the device-side opening when the light emitting/receiving device is mounted on the mounting surface where the device-side opening is placed. Therefore, the reflecting surface adjoining the device-side opening is held excellent in its light reflectivity.

In one embodiment of the present invention, the device-side opening is rectangular-shaped.

According to this embodiment, since the device-side opening is rectangular-shaped, excellent light reception/emission efficiency can be obtained by mounting the light-receiving device having a rectangular light-receiving portion or a light-emitting device having a rectangular light-emitting portion.

The present invention also provides a method for manufacturing a submount for a light emitting/receiving device, comprising the steps of:
- performing etching from a face of a substrate opposite to a mounting surface on which a light emitting/receiving device is mounted to form an outer opening and a through hole adjoining the outer opening; and
- removing a portion of the substrate corresponding to the mounting surface to form a device-side opening adjoining the through hole and having a specified size.

According to this invention, the outer opening and the through hole adjoining the outer opening are formed by performing etching of the substrate, starting from the face opposite to the mounting surface. The through hole is formed by, for example, anisotropic etching so that the inner side face forms a specified angle against the face opposite to the mounting surface. The thickness of this removal portion is adjusted by removing the mounting surface portion of the substrate, so that the device-side opening adjoining the through hole having the inner side face is adjusted in size easily and with high accuracy.

In one embodiment of the present invention, the portion of the substrate corresponding to the mounting surface (4) is removed by polishing.

According to this embodiment, the size of the device-side opening can be adjusted easily by removing the portion of the substrate corresponding to the mounting surface by polishing.

EFFECT OF INVENTION

As described above, the submount for the light emitting/receiving device according to the invention is so constructed that the reflecting surface is formed parallel with a specified crystal orientation face, where the reflecting surface continue into the device-side opening provided in the mounting surface for the light emitting/receiving device to be mounted, and the outer opening provided in the face opposite to the mounting surface. Therefore, light inputted to or outputted from the light emitting/receiving device can be reflected with high efficiency. By crystal anisotropic etching for example, it is possible to easily form the reflecting surface parallel with the crystal orientation face. Thus, it is possible to easily form a submount for a light emitting/receiving device having excellent light transmission performance.

According to the method for manufacturing a submount for a light emitting/receiving device in the present invention, which includes a step of etching from a face of the substrate opposite to the mounting surface to form an outer opening and a through hole adjoining the outer opening by performing, and a step of removing the mounting surface portion of the substrate to form a device-side opening adjoining the through hole and having a specified size, it becomes implementable to adjust the size of the device-side opening easily and with high efficiency.

DESCRIPTION OF SYMBOLS

1 Submount Main Body
3 Through Hole
4 Device Mounting Surface
11 Light-emitting device
12 Light-emitting portion Of Light-emitting device
13 Electrode
31 Device-Side Opening
32 Outer Opening

BEST MODE FOR CARRYING OUT THE INVENTION

Hereinbelow, the present invention will be described in detail by way of embodiments thereof illustrated in the accompanying drawings.

Figure 1:
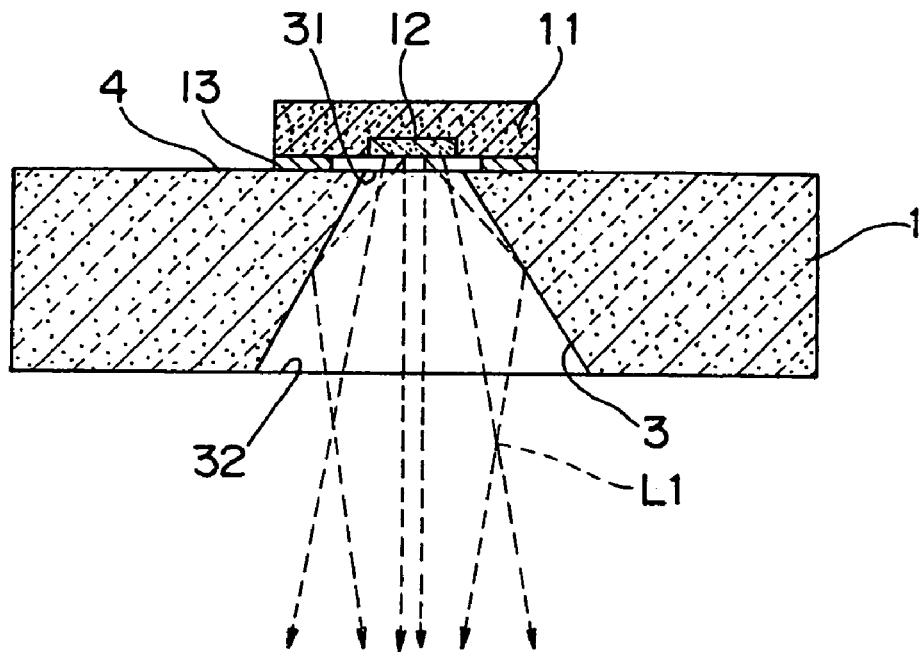
FIG. 1 is a schematic sectional view showing a submount for a light-emitting device according to an embodiment of the present invention.

FIG. 1 is a schematic sectional view showing a submount for a light-emitting device according to an embodiment of the present invention.

This submount for a light-emitting device includes a submount main body 1, a through hole 3 formed in the submount main body 1 by anisotropic etching, a device-side opening 31 formed in a light-emitting device mounting surface 4 of the submount main body and adjoining the through hole 3, and an outer opening 32 formed in an outer side face opposed to the light-emitting device mounting surface 4 of the submount main body 1. On the light-emitting device mounting surface 4 of the submount, a light-emitting device 11 is mounted via an electrode 13, so that a light-emitting portion 12 of this light-emitting device faces the device-side opening 31. That is, the light-emitting device 11 is electrically and mechanically connected to the submount via the electrode 13 in a face-down state. The electrode 13 may be an electrode that actually supplies electric power to the light-emitting device 11 or a dummy electrode that does not supply electric power.

In the submount having the above-described construction, light L1 emitted from the light-emitting portion 12 of the light-emitting device is emitted outside from the outer opening 32 via the through hole 3 of the submount. Part of the light is reflected by the reflecting surface formed at the surface of the through hole 3 so as to be emitted outside. It is noted here that the term 'outside' refers to the atmosphere when the submount and the light-emitting device 11 are used for illumination or spatial transmission, and to optical fibers when used for optical fiber communications.

In this submount, the through hole 3 is formed by anisotropic etching of the submount main body 1. The surface of the through hole 3 is formed in a face parallel with a specified-orientation face of material forming the submount main body 1. Accordingly, the reflecting surface, which is the surface of the through hole 3, has a comparatively high reflectivity to light. Thus, the submount is capable of fulfilling excellent light transmission performance for the light emitted by the light-emitting device 11. In addition, a metal film of, typically, Al or the like may be formed at the surface of the through hole 3 for enhancement of the light reflectivity of the reflecting surface.

With respect to the submount according to this embodiment, measurement of radiation amount was carried out. GaAs LED was used as the light-emitting device 11. The GaAs LED was a cubic of a 0.3 mm side in outside dimension and had a 0.15 mm square light-emitting portion. The entirety of the light-emitting device 11 except its light-emitting portion was brought into contact with the submount via the electrode 13. The submount was 1 mm square in its planar size, and 0.3 mm thick. The device-side opening 31 provided in the light-emitting device mounting surface was 0.15 mm square in size.

As a comparative example, measurement of radiation amount was carried out with respect to a submount on which the light-emitting device 11 was mounted in a state that the light-emitting portion thereof was oppositely directed to the submount mounting surface.

Then, heat resistances of the two submounts were measured. The heat resistances were those from the active layer of the light-emitting device 11 to a surface of the submount opposite to the surface of the submount on which the light-emitting device 11 is mounted. As the result, a heat resistance of the comparative example submount was 95° C./W while a heat resistance of the submount of this embodiment was 23° C./W. From this result, it can be considered that the submount according to this embodiment makes it achievable to improve its heat characteristics. The surface of the through hole formed by anisotropic etching is used as a reflecting surface, and thereby light transmission performance is improved, so that the light-emitting device 11 can be driven with less power consumption than in the comparative example.

Figure 2:
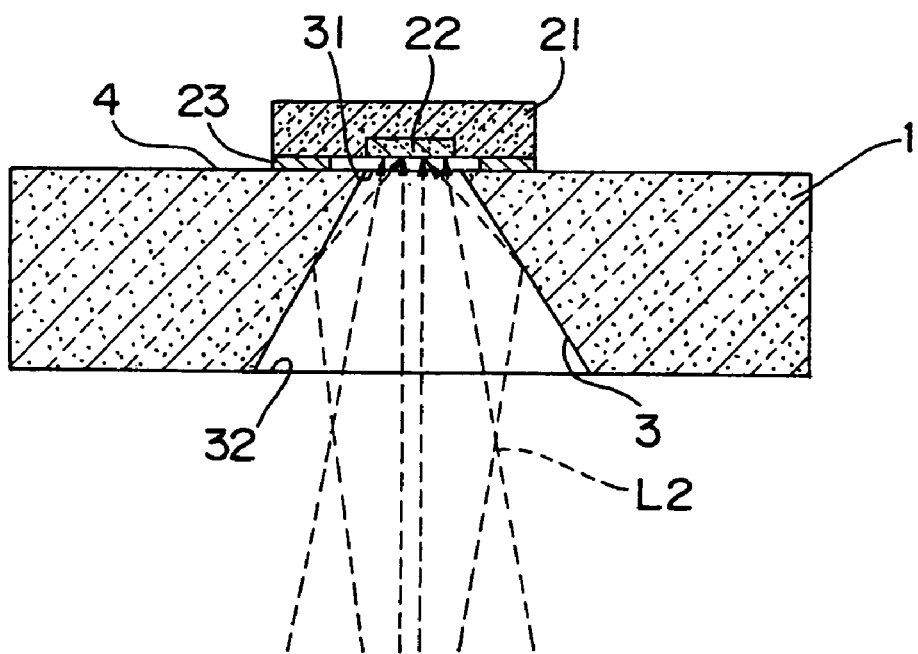
FIG. 2 is a schematic sectional view showing a submount for a light-receiving device according to an embodiment of the invention.

FIG. 2 is a schematic sectional view showing a submount for a light-receiving device as another embodiment of the invention. In the submount for the light-receiving device according to this embodiment, like component parts in conjunction with the submount for the light-emitting device of the foregoing embodiment are designated by like reference numerals, and their detailed description is omitted. As in the case of the foregoing submount for the light-emitting device, in this submount for the light-receiving device, the light-receiving device 22 is mounted on a device mounting surface via an electrode 23. The electrode 23 may be one which supplies electric power to the light-receiving device 22 or another which is a dummy electrode. In the submount for the light-receiving device according to this embodiment, light L2 derived from outside is passed through via an outer opening 32, a through hole 3 and a device-side opening 31 toward the mounting surface 4. Part of the light derived from the outer opening 32 is reflected by a reflecting surface of the through hole 3 so as to be directed toward the device-side opening 31. Light that has passed through the device-side opening 31 is received by a light-receiving portion 22 of the light-receiving device. In the submount for the light-receiving device according to this embodiment, the through hole 3 is formed by anisotropic etching of the submount main body 1, so that the surface of the through hole 3 is formed in a plane parallel with a specified-orientation face in the formation material of the submount main body 1. Accordingly, the reflecting surface, which is the surface of the through hole 3, has a comparatively high reflectivity to light. Thus, the submount is capable of fulfilling excellent light transmission performance for the light emitted by the light-emitting device 21.

The submount for the light-emitting device or the light-receiving device according to the foregoing embodiments can be formed at low cost by using single crystal silicon.

Figure 3A:
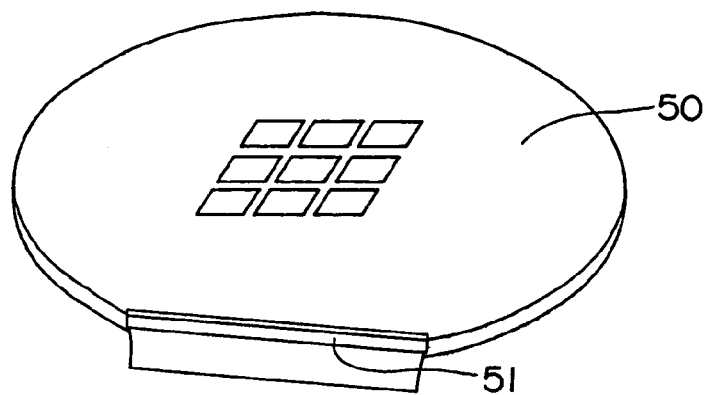
FIG. 3A is a perspective view showing a wafer of single crystal silicon from which a submount main body is formed.
Figure 3B:
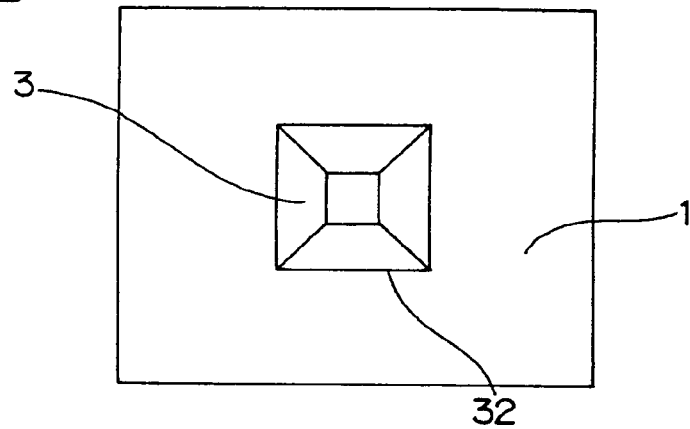
FIG. 3B is a plan view showing a state that a through hole is formed in the submount main body made of the wafer of single crystal silicon.

For example, etching is performed on a wafer of single crystal silicon as shown in FIG. 3A, where a surface 50 is a (100)-oriented surface and an orientation-flat end face 51 is a (110)-oriented surface. This etching is performed on a face of the wafer by KOH or other alkaline aqueous solution while using a mask which is given by a pattern formed by a line parallel with the orientation flat and a line orthogonal to the orientation flat. Then, the single crystal silicon forming the wafer is 100 times or more slower in etching speed in the (111)-oriented surface than in the other faces. Thereby, anisotropic etching is performed, so that a pyramidal-shaped through hole 3 formed by the (111)-oriented surface is obtained, as shown in the plan view of FIG. 3B.

Figure 3C:
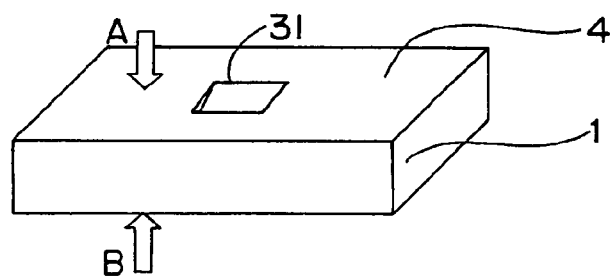
FIG. 3C is a perspective view showing a state of the submount main body viewed from the device mounting surface side.
Figure 3D:
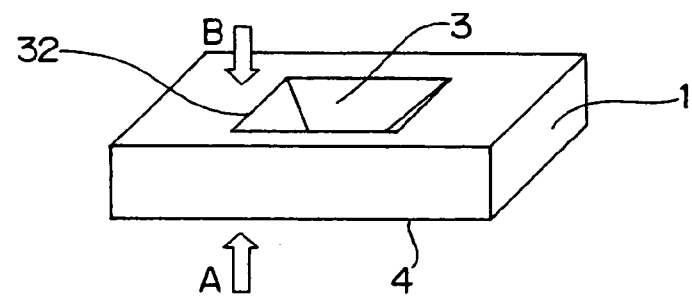
FIG. 3D is a perspective view showing a state of the submount main body viewed from the outer side face.

FIGS. 3C and 3D are perspective views showing appearances that the through hole 3 is formed in the submount main body 1 by the etching. FIG. 3C is a view as the submount main body 1 is viewed from the device mounting surface side. FIG. 3D is a view as the submount main body 1 is viewed from the outer side face. As can be understood from FIGS. 3C and 3D, by forming the through hole 3 in the single crystal silicon by anisotropic etching, an outer opening 32 which is larger in area than the device-side opening 31 of the device mounting surface can be formed on the outer side face of the submount main body. The single crystal silicon, which is relatively excellent in heat dissipation, is commonly used for submounts for various kinds of devices. Therefore, mass production of submounts having the through hole 3 can be implemented by normal planar process.

Hereinbelow, a method for manufacturing the submount for the light emitting/receiving device according to the present invention is explained.

The single crystal silicon to be used for the submount of the present invention, although being preferably about 0.3 to 0.5 mm in view of heat dissipation and handlability, may be selected as required depending on the use of the submount.

Figure 4A:
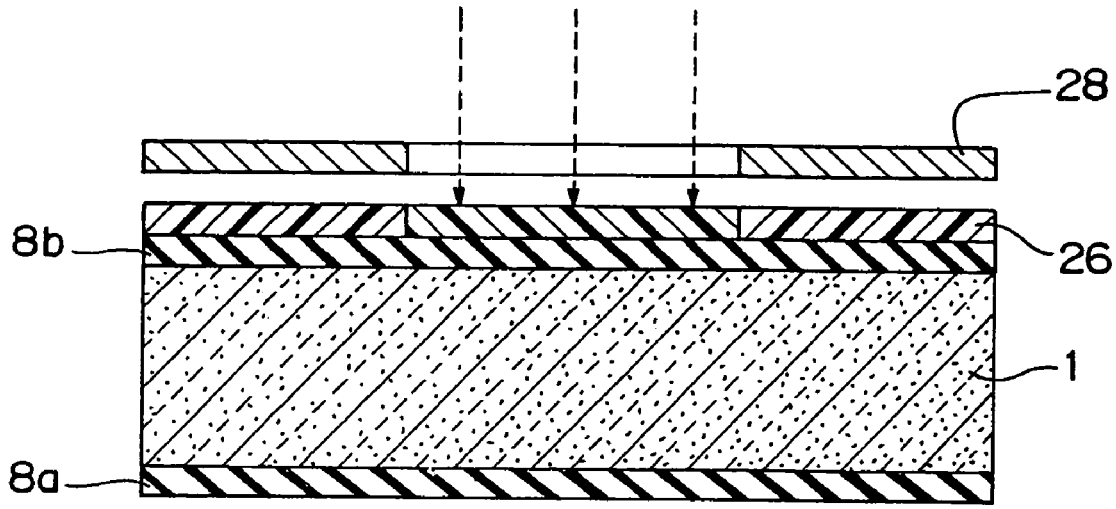
FIG. 4A is a sectional view showing a state that an opening mask pattern is formed on the surface of the submount main body.

First, thermal oxides 8a, 8b are formed on a device mounting surface and an outer side face, respectively, of a body 1 as a substrate composed of single crystal silicon. These thermal oxides may be replaced with nitrides. Then, as shown in FIG. 4A, photoresist 26 is formed on the thermal oxide 8b of the outer side face. The photoresist 26 is exposed to light in a specified pattern with a photomask 28, by which a resist pattern is formed. Then, a portion of the thermal oxide 8b exposed by removal of the photoresist 26 is removed by dry etching process or the like to form an opening mask pattern. This opening mask pattern is formed into a size determined by the thickness of the body 1 composed of single crystal silicon, the type and concentration and the like of an etchant for the etching of the single crystal silicon, and the size of the device-side opening formed in the device mounting surface.

Figure 4B:
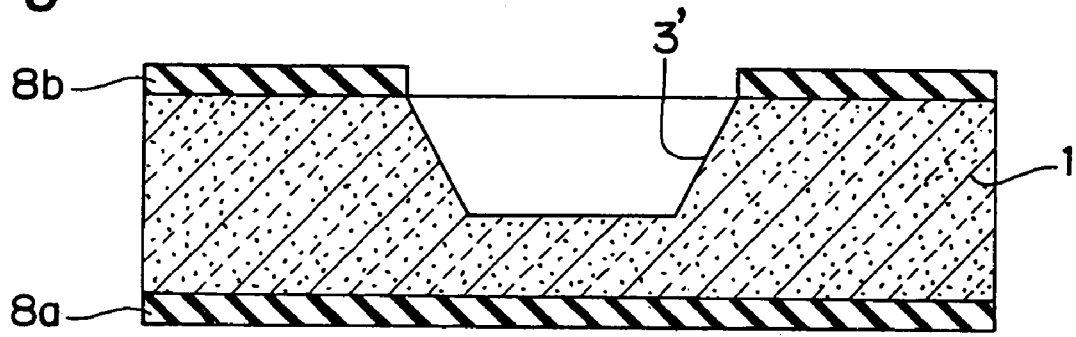
FIG. 4B is a sectional view showing a state that anisotropic etching is performed on the submount main body.
Figure 4C:
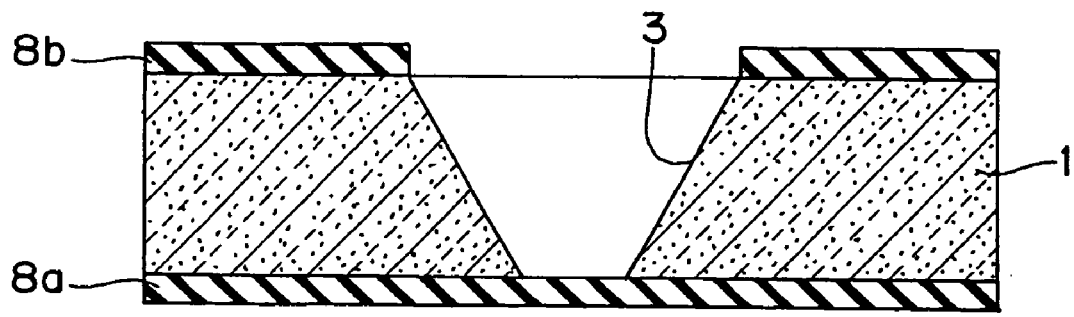
FIG. 4C is a sectional view showing a state that a through hole has been formed in the submount main body.

Subsequently, while the thermal oxide 8b having the opening mask pattern formed therein is used as a mask, anisotropic etching is performed by using an alkaline etchant such as KOH (potassium hydroxide). FIG. 4B shows a state that anisotropic etching has progressed to a generally center of the submount main body 1 in its thickness direction. Then, when the anisotropic etching has reached the device mounting surface, the progress of etching is halted by the thermal oxide 8a of the surface. As a result, as shown in FIG. 4C, a through hole 3 having a surface parallel with the (111)-oriented surface is obtained. After that, the thermal oxides 8a, 8b are removed by etchant using hydrofluoric acid or the like.

Although the thermal oxide 8*b* is used as the mask for anisotropic etching in this embodiment, yet nitride may be used instead. Also, although single crystal silicon is used for the submount main body 1, yet any other material may also be used if it is enough slower in etching rate in a specific crystal orientation face than in the other orientation faces.

A reflecting surface is formed at the through hole 3 formed in the submount main body 1 so as to reflect light inputted to or outputted from the light emitting/receiving device. Whereas the surface of the through hole 3 formed by the anisotropic etching is flat, enough reflectivity could not be obtained with silicon exposed from the surface, depending on the wavelength of the light to be reflected. Thus, it is preferable to form a metal film using a metal having a relatively high reflectivity such as Al or Au on the surface of the through hole 3.

Figure 5A:
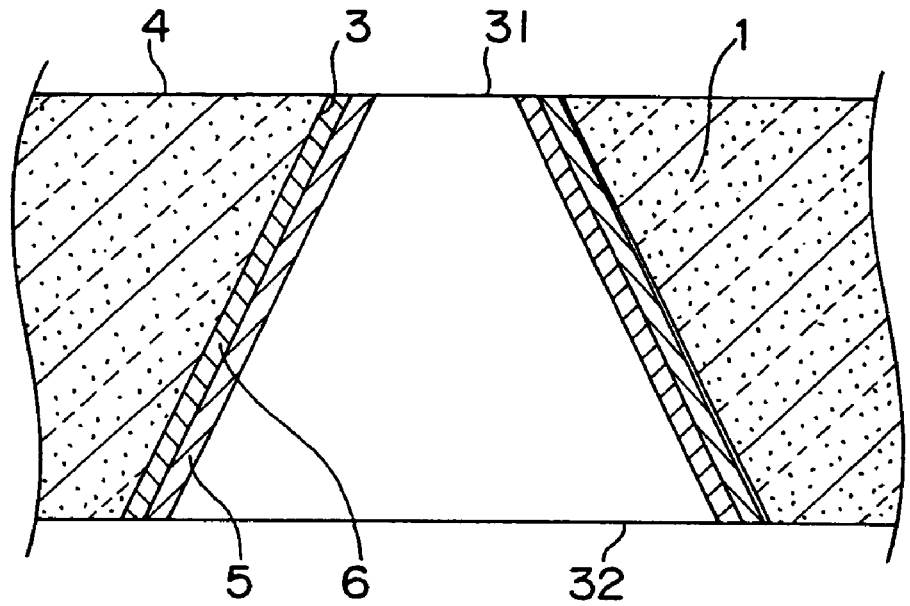
FIG. 5A is a sectional view showing a state that a reflecting surface has been formed in the through hole.

When the metal film is formed by deposition, Au or Al may be diffused into silicon, or the deposited film may be crystallized by an effect of silicon. Therefore, as shown in FIG. 5A, it is preferable to form a high melting metal film 6 on the inner side face of the through hole 3 where silicon is exposed, and a metal film 5 composed of Au or Al on the surface of the high melting metal film 6, as described above.

Figure 5B:
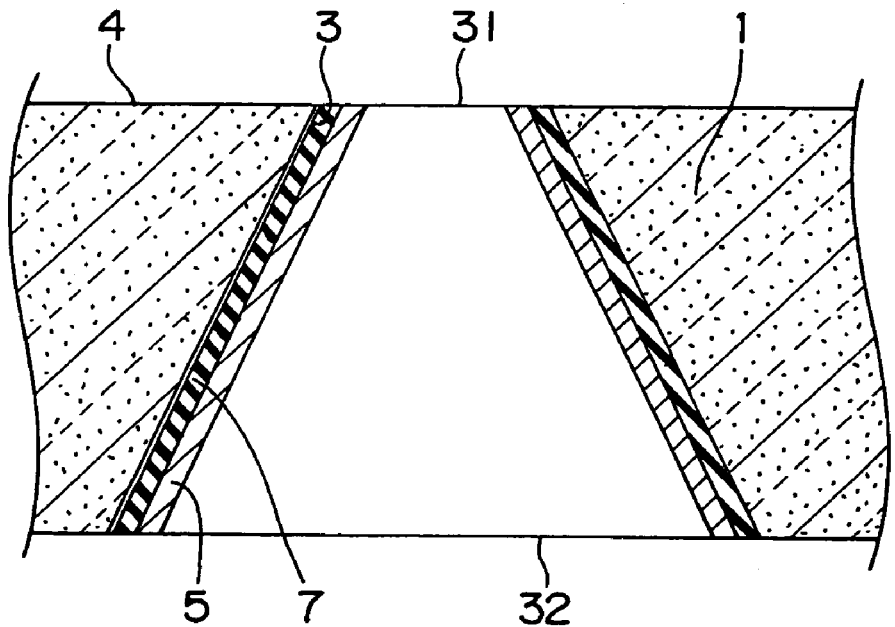
FIG. 5B is a sectional view showing a state that another reflecting surface has been formed in the through hole.

Further, as shown in FIG. 5B, an amorphous dielectric film 7 of oxide or nitride is formed on the inner side face of the through hole 3 where silicon is exposed. A reflecting film 5 is then formed on the surface of the dielectric film 7. Thereby, an excellent reflecting surface of less surface roughness can be obtained.

Further, it is also allowable to form a high melting metal film containing, for example, Ti, Cr or Ta on the inner side face of the through hole 3, to form a dielectric film composed of oxide or nitride or the like on the surface of the high melting metal film, and to form a metal film composed of Au and Al on the surface of the dielectric film. This structure makes it possible to obtain a reflecting surface of excellent durability and high reflectivity.

Figure 6A:
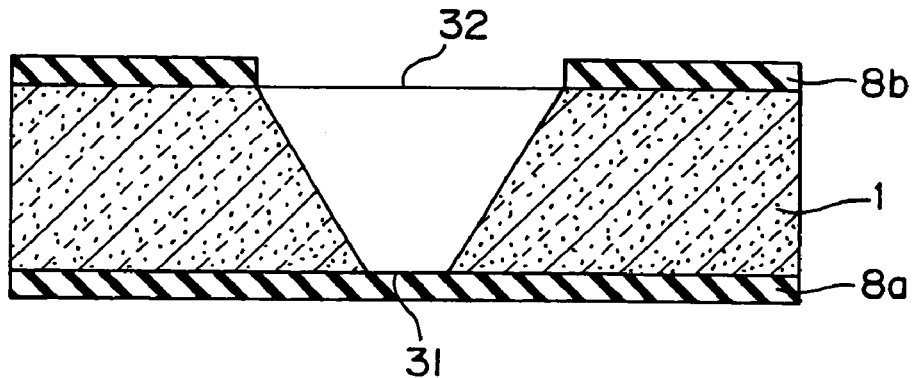
FIG. 6A is a sectional view showing the through hole formed in the submount main body.
Figure 6B:
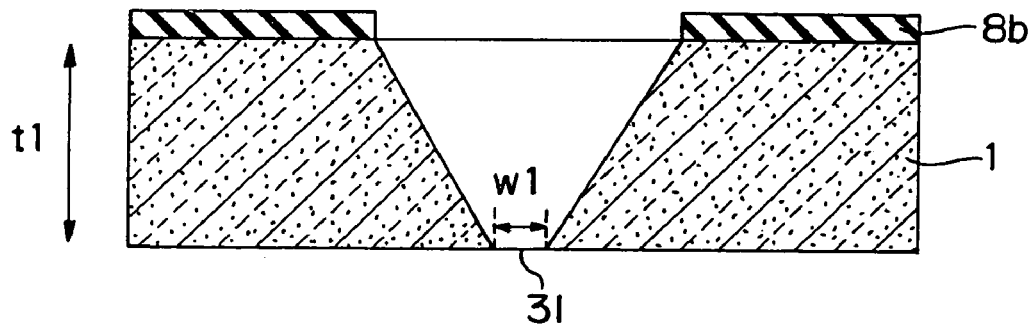
FIG. 6B is a sectional view showing a relationship between a thickness of the submount main body and a size of the device-side opening.
Figure 6C:
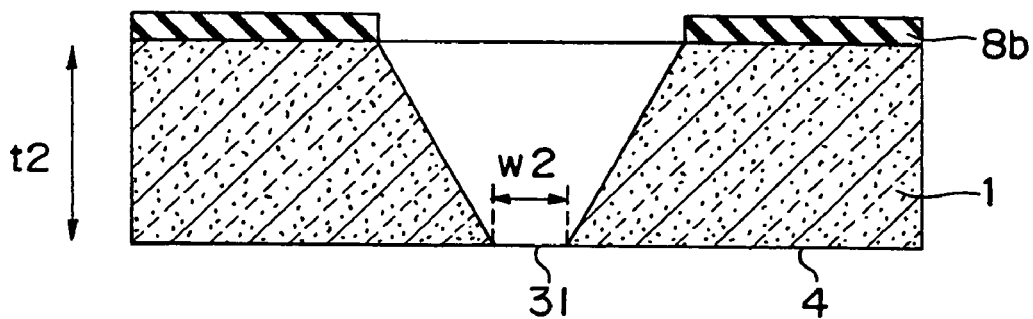
FIG. 6C is a sectional view showing a relationship between a thickness of the submount main body and a size of the device-side opening.
Figure 6D:
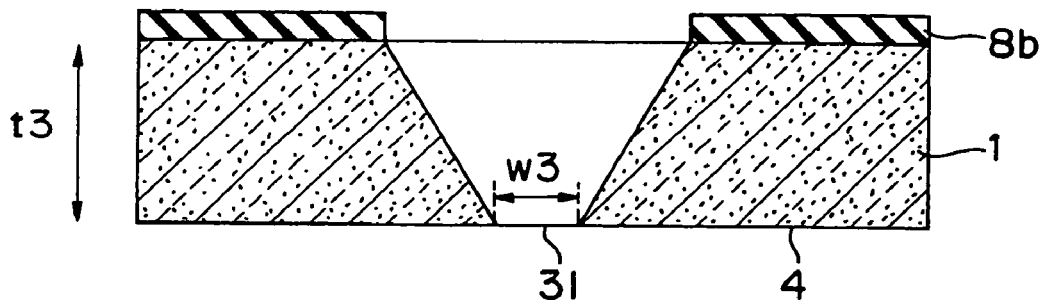
FIG. 6D is a sectional view showing a relationship between a thickness of the submount main body and a size of the device-side opening.

In the manufacturing method for the submount for the light emitting/receiving device according to this embodiment, the outer opening 32, which is formed in the outer side face by anisotropic etching, has its size determined with high accuracy by the opening mask pattern of the thermal oxide 8*b*, as shown in FIG. 6A. Meanwhile, the device-side opening 31 formed in the device side face varies its size depending on the thickness of the body 1. For example, if the thicknesses of the body 1 is in an increasing order that t1<t2<t3 as shown in FIGS. 6B, 6C and 6D, the size of the device-side opening 31 is in a decreasing order that w1>w2>w3. That is, the thickness of the body 1 and the size of the device-side opening 31 are inversely proportional to each other. This becomes a problem when requiring high accuracy in the size of the device-side opening 31.

In this case, when the single crystal silicon substrate is etched with a strong alkaline solution, the (111)-oriented surface, although slower in etching rate than the other orientation faces, yet is not entirely kept from being etched. Therefore, the size of the device-side opening 31 can be adjusted by adjusting etching time, etching rate or the like. However, the slow etching rate would involve large time and labor.

Consequently, it is preferable to adjust the size of the device-side opening 31 by polishing the device mounting surface 4 of the body 1 after the completion of the anisotropic etching. That is, because the inner side face of the through hole 3 is inclined at a specified angle against the device mounting surface, the size of the device-side opening 31 can be adjusted with high accuracy by adjusting the thickness of the device mounting surface 4 of the body 1 with polishing.

Thus, preferably, the body 1 is formed to a thickness larger than a design value before the execution of the anisotropic etching. After the anisotropic etching is carried out, the size of the device-side opening 31 is adjusted while the thickness of the body 1 is adjusted. In addition, the body 1 may be formed to a specified thickness at a stage before the execution of the anisotropic etching.

Figure 7A:
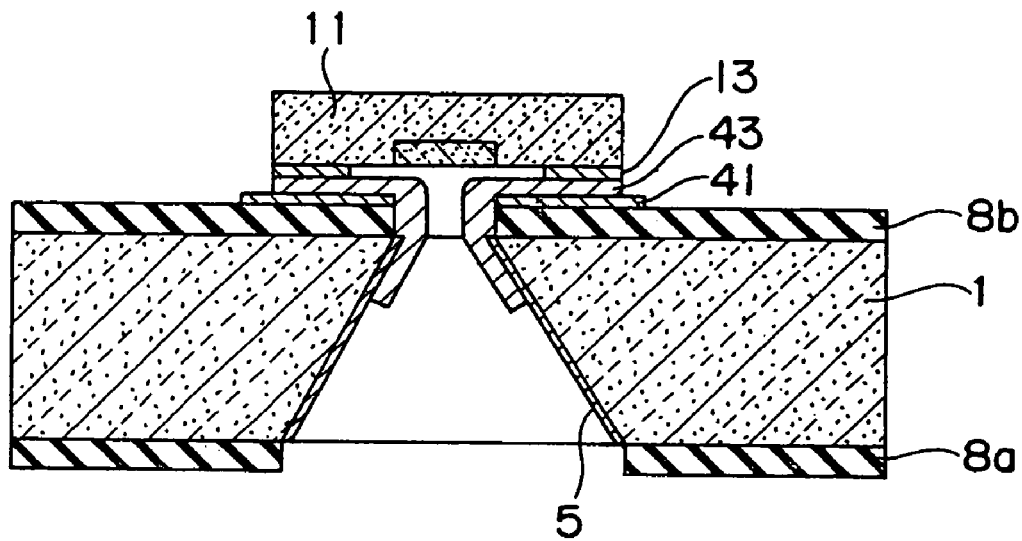
FIG. 7A is a sectional view showing a state that a brazing material for connection of the electrodes of the light-emitting device is diffused to the reflecting surface of the submount.
Figure 7B:
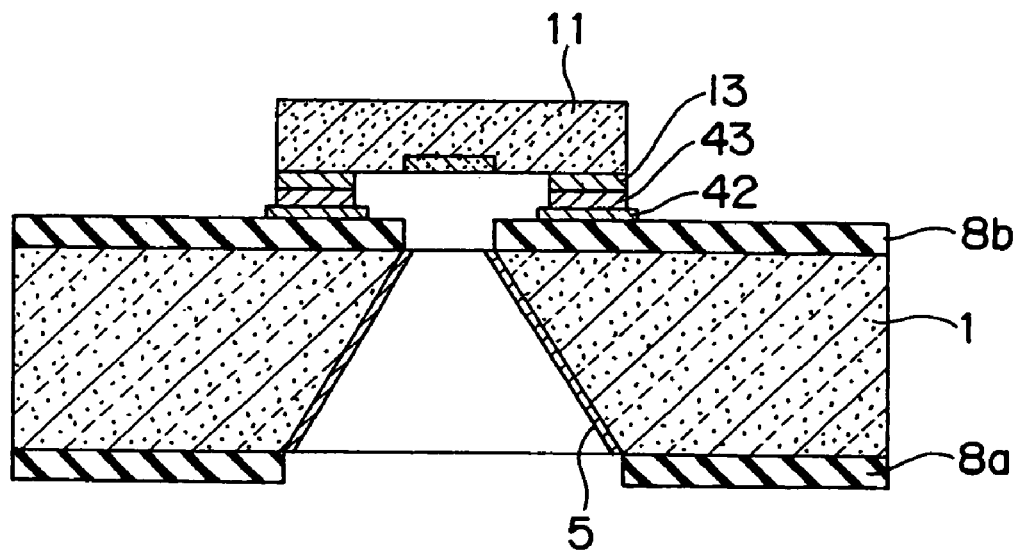
FIG. 7B is a sectional view showing a structure for prevention of the brazing material to the reflecting surface.

Preferably, the submount for the light emitting/receiving device according to this embodiment has a dielectric film that surrounds the device-side opening 31. FIG. 7A shows a state that an electrode 41 on the submount side is formed so as to surround the device-side opening 31, and that an electrode 13 on the light-emitting device 11 is connected to the electrode 41. The electrode 41 on the submount and the electrode 13 on the light-emitting device are connected to each other with a brazing material 43 such as Ag paste or AuSn. In this case, since the electrode 41 is formed so as to surround the device-side opening 31, the brazing material 43 may be diffused into the through hole from an end portion of the electrode 41 located on the side of the device-side opening 31. In this case, the brazing material 43 comes into contact with the reflecting film 5 made of metal within the through hole, causing a disadvantage that the reflecting film 5 lowers in its light reflection performance. Accordingly, as shown in FIG. 7B, it is preferable that an end portion of a submount-side electrode 42 on the device-side opening 31 side is spaced from the opening 31, and thereby a dielectric film 8*b* is exposed to around the device-side opening 31. Thus, surrounding the opening 31 by the exposed dielectric film 8*b* makes it possible to prevent the brazing material from intruding into the through hole. Also, a dielectric film composed of SiO2 or the like may be placed at an end portion or on a surface of the reflecting film 5 located on the side of the light emitting/receiving device so as to prevent the intrusion of the brazing material.

Figure 8A:
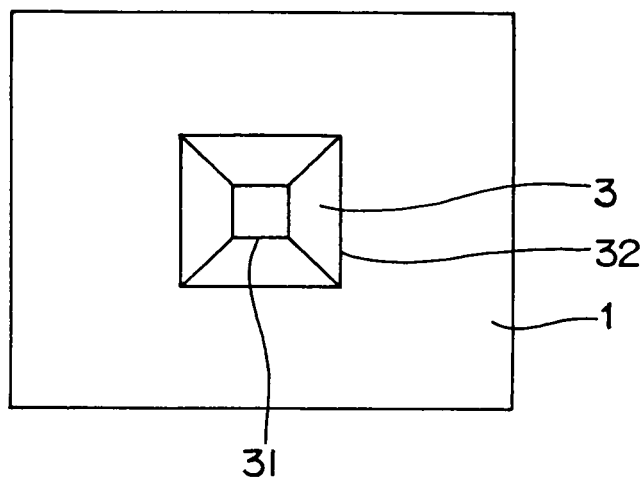
FIG. 8A is a plan view showing an opening of the submount main body.
Figure 8B:
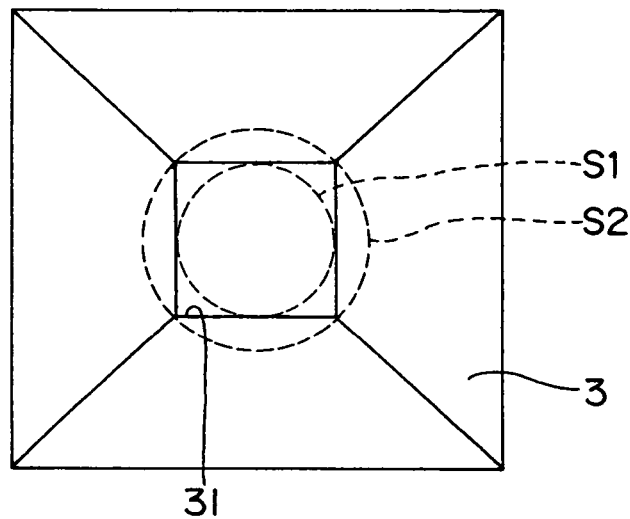
FIG. 8B is a view showing a shape of rectangular light emitting/receiving parts and a shape of the opening of the submount main body as they are overlapped.
Figure 8C:
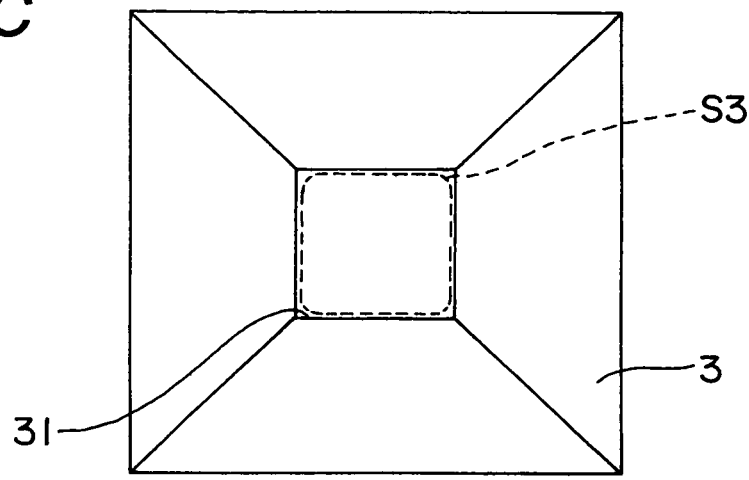
FIG. 8C is a view showing a shape of circular light emitting/receiving parts and a shape of the opening of the submount main body as they are overlapped.
Figure 9A:
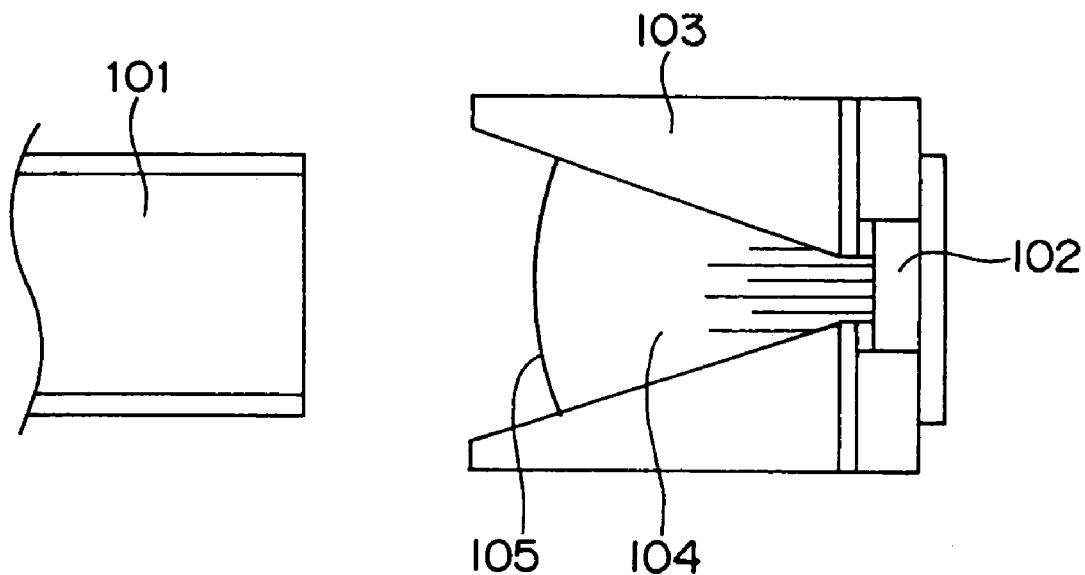
FIG. 9A is a sectional view showing a light guide unit provided with a conventional submount.
Figure 9B:
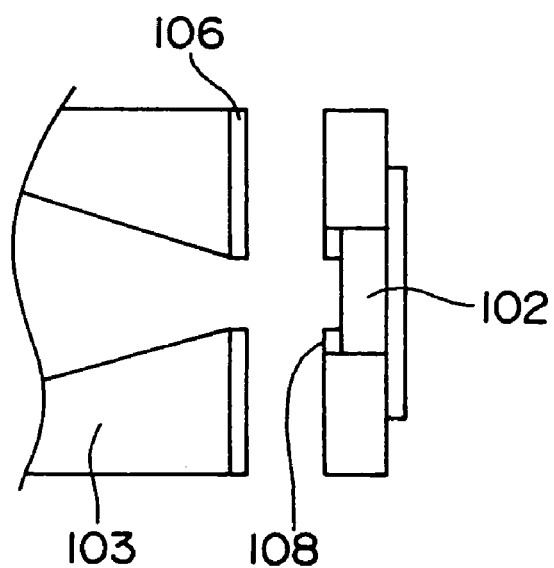
FIG. 9B is a sectional view showing a state just before a light-emitting device is connected to the conventional submount.

Furthermore, as shown in FIG. 8A, the submount for the light emitting/receiving device according to this embodiment is suitable for formation of rectangular-shaped openings 31, 32 in a plane view. In the case where the light-receiving portion of the light-receiving device and the light-emitting portion of the light-emitting device are circular-shaped in a plane view, and where the light-receiving portion and the light-emitting portion have a shape S1 smaller than the device-side opening 31, as shown in FIG. 8B, the ratio of part of the device opening 31 through which light need not pass becomes relatively larger. On the other hand, in the case where the light-receiving portion and the light-emitting portion have a shape S2 larger than the device-side opening 31, not all light passes through the device opening 31 as shown in FIG. 8B. Thus, there may arise a problem of deterioration in the light transmission efficiency between the light emitting/receiving device and external equipment for this light emitting/receiving device. Accordingly, in the submount for light emitting/receiving device according to this embodiment, it is preferable from a point of view of improving the light transmission performance that, as shown in FIG. 8C, on the device-side opening 31 is mounted a light emitting/receiving device having a light receiving/emitting part which is rectangular shaped in a plane and which is generally identical in shape and area to the device-side opening 31.

The invention claimed is:

1. A submount for a light emitting/receiving device, comprising:
   a mounting surface on which a light emitting/receiving device is mounted;

a device-side opening which is provided in the mounting surface and through which light inputted to or outputted from the light emitting/receiving device passes;

an outer opening provided in a face facing the mounting surfaces, said device-side opening and side outer opening being open to the device which is spaced from the device-side opening;

a reflecting surface which adjoins the device-side opening and the outer opening and which is formed parallel with a specified crystal orientation face so as to reflect the light between one side on which the light emitting/receiving device is provided and another side on which the outer opening is opened;

a dielectric film which is formed on the mounting surface and which surrounds the device-side opening;

an electrode which is formed on the dielectric film and an inner end portion of which is spaced laterally at a specified distance from the device-side opening but does not extend laterally toward said device-side opening beyond said dielectric film; and a brazing material layer between and securing together the device and said inner end portion, said layer not extending to said opening when molten due to said lateral spacings.

2. The submount for the light emitting/receiving device as claimed in claim 1, wherein the submount is formed of single crystal silicon;

the mounting surface is parallel with a (100)-oriented surface of the single crystal silicon, and the reflecting surface is parallel with a (111)-oriented surface of the single crystal silicon.

3. The submount for the light emitting/receiving device as claimed in claim 1, further comprising:

a through hole for connecting the device-side opening and the outer opening to each other; and a metal film formed on an inner side face of the through hole wherein a surface of the metal film serves as the reflecting surface.

4. The submount for the light emitting/receiving device as claimed in claim 1, wherein the device-side opening is rectangular-shaped.

* * * * *